(12) United States Patent
Tsai et al.

(10) Patent No.: US 11,962,060 B2
(45) Date of Patent: Apr. 16, 2024

(54) RESONANCE BODY AND POWER DIVIDING AND COMBINING DEVICE

(71) Applicant: AMPAK TECHNOLOGY INC., Hukou Township, Hsinchu County (TW)

(72) Inventors: Fure-Tzahn Tsai, Hukou Township (TW); Ruey Bing Hwang, Hukou Township (TW); Tso Hua Lin, Hukou Township (TW); Chih Wei Wang, Hukou Township (TW); Tzong-Yow Ho, Hukou Township (TW)

(73) Assignee: AMPAK TECHNOLOGY INC., Hukou Township (TW)

( * ) Notice: Subject to any disclaimer, the term of this patent is extended or adjusted under 35 U.S.C. 154(b) by 307 days.

(21) Appl. No.: 17/304,311

(22) Filed: Jun. 17, 2021

(65) Prior Publication Data
US 2021/0399399 A1  Dec. 23, 2021

(30) Foreign Application Priority Data
Jun. 17, 2020  (TW) .................................. 109120411

(51) Int. Cl.
*H01P 5/16* (2006.01)
*H05K 5/03* (2006.01)
*H05K 7/14* (2006.01)

(52) U.S. Cl.
CPC .................. *H01P 5/16* (2013.01); *H05K 5/03* (2013.01); *H05K 7/14* (2013.01)

(58) Field of Classification Search
CPC ............... H01P 5/16; H05K 5/03; H05K 7/14
See application file for complete search history.

(56) References Cited

U.S. PATENT DOCUMENTS 3,091,743 A * 5/1963 Wilkinson ................ H01P 5/16
                                                       333/127
4,371,845 A * 2/1983 Pitzalis, Jr. ............... H03F 3/68
                                                       333/127

(Continued)

FOREIGN PATENT DOCUMENTS

| CN | 101897077 | 11/2010 |
| CN | 103985945 | 8/2014 |
| CN | 106992348 | 7/2017 |

*Primary Examiner* — Andrea Lindgren Baltzell
*Assistant Examiner* — Kimberly E Glenn
(74) *Attorney, Agent, or Firm* — LIU & LIU (57) ABSTRACT

A power dividing and combining device comprising a resonance body, a plurality of circuit boards, an upper cover and a lower cover is provided. The resonance body comprises a solid conductive body, a plurality of first dividing elements, a plurality of second dividing elements, a signal-receiving end and a signal-transmitting end. The solid conductive body has a first surface, a second surface opposite to the first surface, and a plurality of side surfaces connecting the first surface and the second surface. The first dividing elements are disposed on the first surface and separate a plurality of first resonance channels on the first surface. The first resonance channels intersect at a first common region on the first surface. The second dividing elements are disposed on the second surface and separate a plurality of second resonance channels on the second surface. The second resonance channels intersect at a second common region on the second surface. The signal-receiving end is disposed on the first surface and in the first common region. The signal-transmitting end is disposed on the second surface and in the second common region. The circuit boards are disposed respectively on the side surfaces. Two opposite ends of each of the circuit boards respectively close one of the first resonance channels and one of the second resonance channels. Each of the circuit boards comprises a power-ampli- (Continued)

fying element. The upper cover is disposed on the first dividing elements. The first resonance channels are located in a first accommodating space formed by the upper cover, the circuit boards and the first surface of the solid conductive body. The lower cover is disposed on the second dividing elements. The second resonance channels are located in a second accommodating space formed by the lower cover, the circuit boards and the second surface of the solid conductive body.

16 Claims, 5 Drawing Sheets

(56) References Cited

U.S. PATENT DOCUMENTS

| | | | | |
|---|---|---|---|---|
| 4,641,106 | A * | 2/1987 | Belohoubek | H03F 3/602 |
| | | | | 333/128 |
| 4,825,174 | A * | 4/1989 | Vella-Coleiro | H03F 1/309 |
| | | | | 330/264 |
| 6,242,984 | B1 * | 6/2001 | Stones | H01P 5/12 |
| | | | | 333/125 |
| 7,746,175 | B2 * | 6/2010 | Rector | H01P 5/12 |
| | | | | 330/53 |
| 8,558,620 | B2 | 10/2013 | Fraysse et al. | |
| 9,509,034 | B2 * | 11/2016 | Xue | H01P 5/12 |
| 9,979,067 | B2 * | 5/2018 | Danderson | H01P 5/16 |
| 2017/0179598 | A1 * | 6/2017 | Kitt | H01Q 9/28 |

* cited by examiner

RESONANCE BODY AND POWER DIVIDING AND COMBINING DEVICE

CROSS REFERENCE TO RELATED APPLICATIONS

This application is based on and claims the benefit of priority from the Taiwanese Patent Application No. 109120411 filed on Jun. 17, 2020, which is incorporated herein by reference.

FIELD OF THE INVENTION

The present invention is related to a resonance body, and in particular to a power dividing and combining device comprising the resonance body.

DESCRIPTION OF THE PRIOR ART

In a conventional approach of power amplification for millimeter waves, a power amplifier as a chip is directly disposed on a circuit board to perform power amplification of signals. One setback of the conventional technique is that, the gain of power amplification of signals is limited by a predetermined power of the power amplification chip itself and the power amplification chip usually does not meet wireless communication requirements for 5G millimeter wave base stations. Further, the temperature of a power amplification chip with large power rises during operation such that heat dissipation may become difficult, hence causing a shortened operation lifecycle thereof. Moreover, power amplification chips with large power are generally product items subject to export control and may not be easily acquired.

SUMMARY OF THE INVENTION

One object of the present invention is to provide a power dividing and combining device including a resonance body. The power dividing and combining device is capable of dividing the power of a received electromagnetic wave signal, and individually amplifying and then combining the divided power thereof, thereby completing power amplification of the electromagnetic wave signal.

The present invention is to provide a power dividing and combining device comprising a resonance body, a plurality of circuit boards, an upper cover and a lower cover is provided. The resonance body comprises a solid conductive body, a plurality of first dividing elements, a plurality of second dividing elements, a signal-receiving end and a signal-transmitting end. The solid conductive body has a first surface, a second surface opposite to the first surface, and a plurality of side surfaces connecting the first surface and the second surface. The first dividing elements are disposed on the first surface and separate a plurality of first resonance channels on the first surface. The first resonance channels intersect at a first common region on the first surface. The second dividing elements are disposed on the second surface and separate a plurality of second resonance channels on the second surface. The second resonance channels intersect at a second common region on the second surface. The signal-receiving end is disposed on the first surface and in the first common region. The signal-transmitting end is disposed on the second surface and in the second common region.

The circuit boards are disposed respectively on the side surfaces. Two opposite ends of each of the circuit boards respectively close one of the first resonance channels and one of the second resonance channels. Each of the circuit boards comprises a power-amplifying element. The upper cover is disposed on the first dividing elements. The first resonance channels are located in a first accommodating space formed by the upper cover, the circuit boards and the first surface of the solid conductive body. The lower cover is disposed on the second dividing elements. The second resonance channels are located in a second accommodating space formed by the lower cover, the circuit boards and the second surface of the solid conductive body.

In an embodiment of the present invention, an arrangement of the first resonance channels is symmetrical to an arrangement of the second resonance channels.

In an embodiment of the present invention, a shape and a position of the signal-receiving end is symmetrical to a shape and a position of the signal-transmitting end, respectively.

In an embodiment of the present invention, the signal-receiving end is a cone and the signal-transmitting end is a cone.

In an embodiment of the present invention, the power dividing and combining device further comprises a plurality of first fixing elements and a plurality of second fixing elements. The first fixing elements are disposed on the upper cover and respectively fixing the circuit boards on the side surfaces. The second fixing elements are disposed on the lower cover and respectively fixing the circuit boards on the side surfaces.

In an embodiment of the present invention, each of the first fixing elements is in electrical contact with a first grounding pad of one of the circuit boards, and each of the second fixing elements is in electrical contact with a second grounding pad of one of the circuit boards.

The present invention is further to provide a resonance body comprising a solid conductive body, a plurality of first dividing elements, a plurality of second dividing elements, a signal-receiving end and a signal-transmitting end. The solid conductive body has a first surface, a second surface opposite to the first surface, and a plurality of side surfaces connecting the first surface and the second surface. The first dividing elements are disposed on the first surface and separate a plurality of first resonance channels on the first surface. The first resonance channels intersect at a first common region on the first surface. The second dividing elements are disposed on the second surface and separate a plurality of second resonance channels on the second surface. The second resonance channels intersect at a second common region on the second surface. The signal-receiving end is disposed on the first surface and in the first common region. The signal-transmitting end is disposed on the second surface and in the second common region.

In an embodiment of the present invention, an arrangement of the first resonance channels is symmetrical to an arrangement of the second resonance channels.

In an embodiment of the present invention, a shape and a position of the signal-receiving end is symmetrical to a shape and a position of the signal-transmitting end, respectively.

In an embodiment of the present invention, the signal-receiving end is a cone and the signal-transmitting end is a cone.

DETAILED DESCRIPTION OF THE EMBODIMENTS

Figure 1:
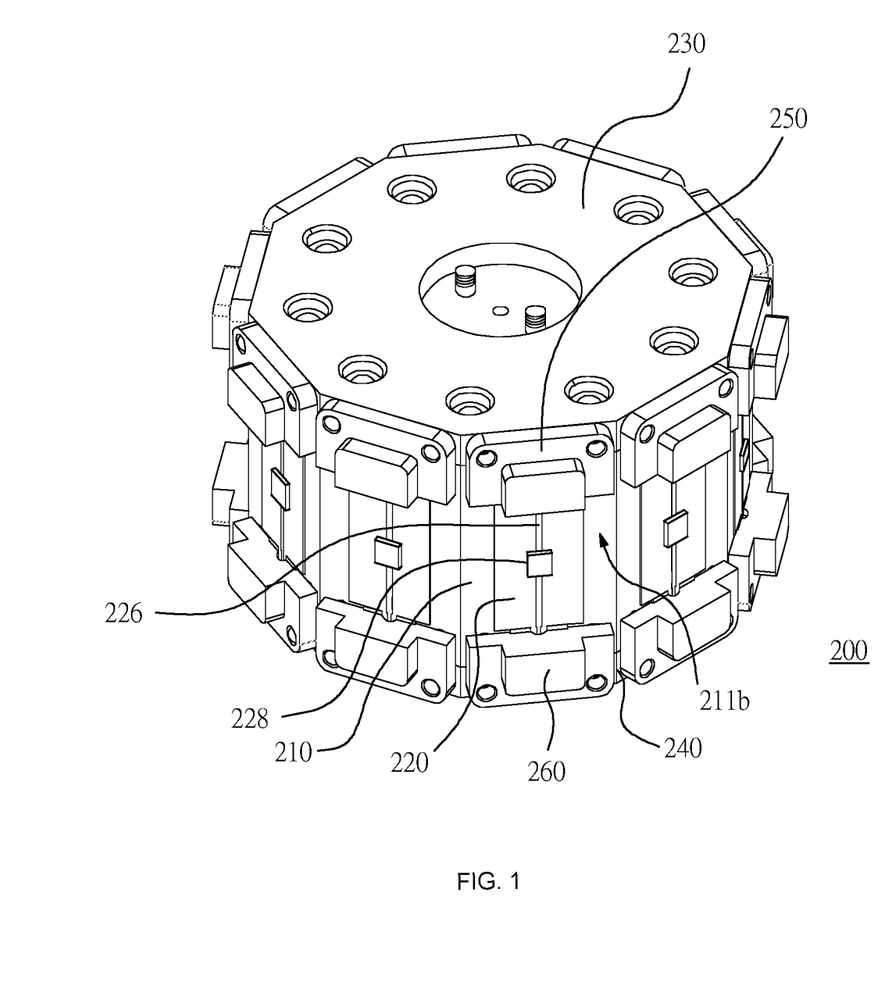
FIG. 1 shows a three-dimensional schematic diagram of a power dividing and combining device according to an embodiment of the present invention.
Figure 2:
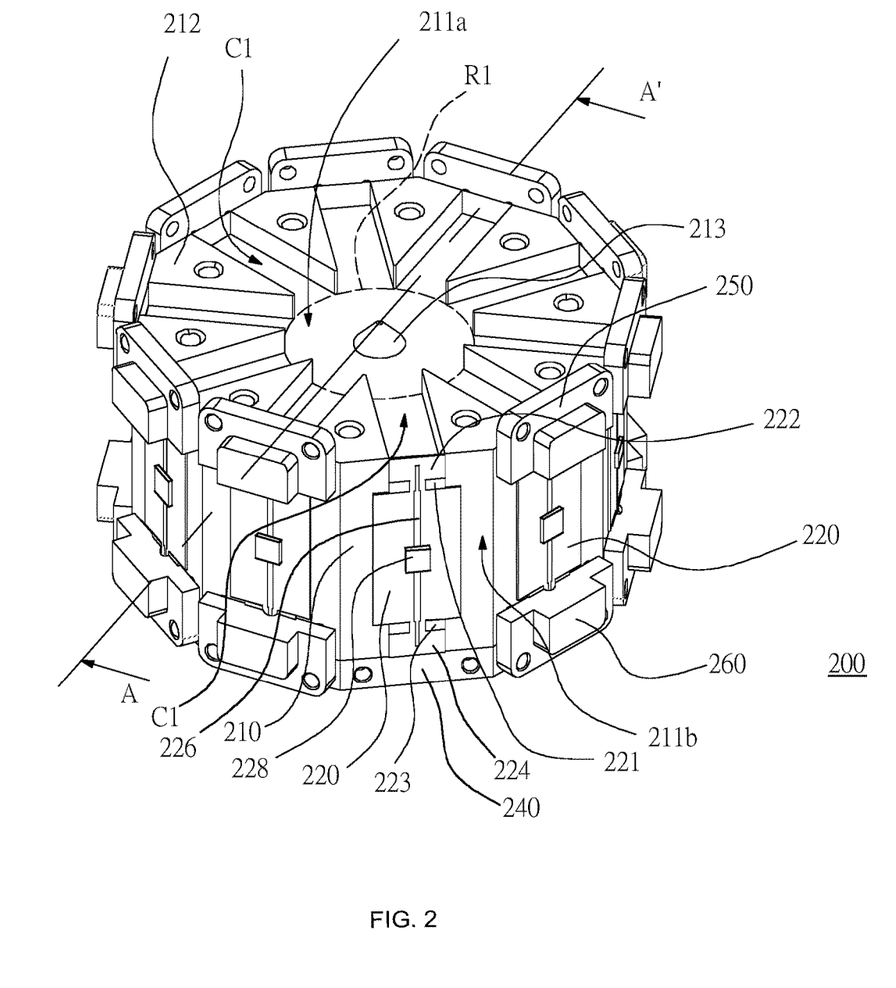
FIG. 2 shows a three-dimensional diagram of the power dividing and combining device in FIG. 1, wherein some of the components omitted.

FIG. 1 shows a three-dimensional schematic diagram of a power dividing and combining device according to an embodiment of the present invention. FIG. 2 shows a three-dimensional diagram of the power dividing and combining device in FIG. 1, wherein some of the components omitted. Referring to FIG. 1 and FIG. 2, a power dividing and combining device 200 according to an embodiment of the present invention includes a resonance body 210, a plurality of circuit boards 220, an upper cover 230 and a lower cover 240. In addition, in this embodiment, the power dividing and combining device 200 further includes a plurality of first fixing elements 250 and a plurality of second fixing elements 260.

Figure 3:
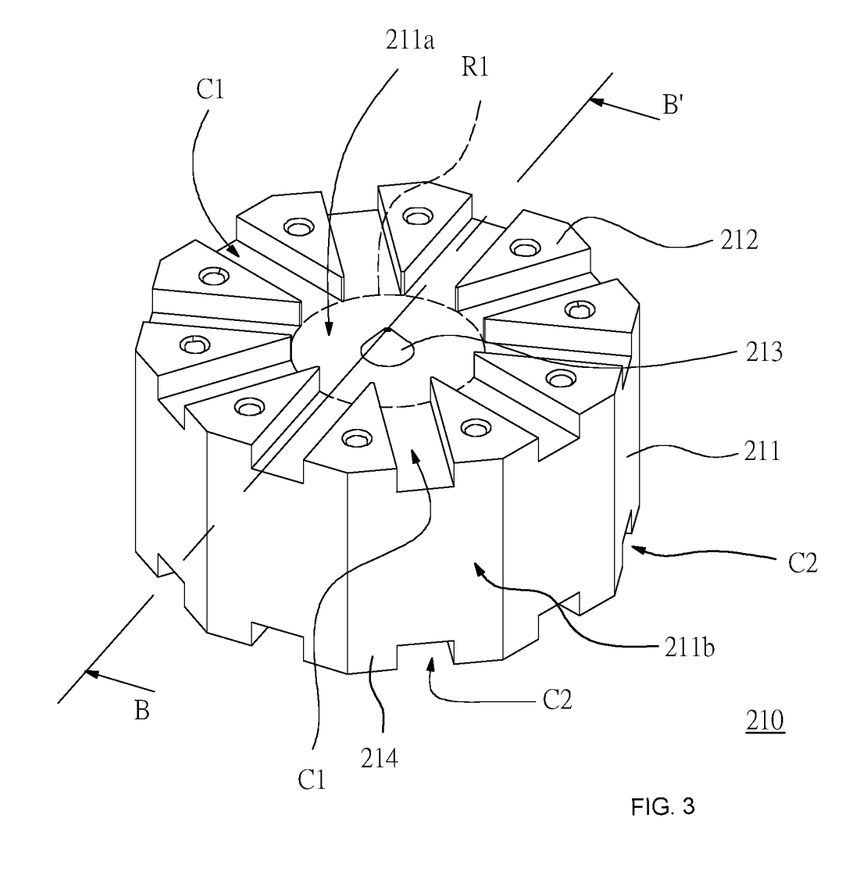
FIG. 3 shows a three-dimensional schematic diagram of a resonance body of the power dividing and combining device of FIG. 1.

FIG. 3 shows a three-dimensional schematic diagram of a resonance body of the power dividing and combining device of FIG. 1. Referring to FIG. 1, FIG. 2 and FIG. 3, the resonance body 210 includes a solid conductive body 211, a plurality of first dividing elements 212 and a signal-receiving end 213. The solid conductive body 211 has a first surface 211a and a plurality of side surfaces 211b connected to the first surface 211a. The first dividing elements 212 (ten first dividing elements 212 illustratively depicted in FIG. 2) are disposed on the first surface 211a of the solid conductive body 211. The first dividing elements 212 separate a plurality of first resonance channels C1 (ten first resonance channels C1 illustratively depicted in FIG. 2) on the first surface 211a. The first resonance channels C1 intersect at a first common region R1 on the first surface 211a. The signal-receiving end 213 is disposed on the first surface 211a of the solid conductive body 211 and is located in the first common region R1. In this embodiment, the signal-receiving end 213 may be located at or near a center of the first surface 211a of the solid conductive body 211.

The circuit boards 220 are respectively disposed on the side surfaces 211b of the solid conductive body 211, and a first end 222 of each of the circuit boards 220 closes one first resonance channel C1 of the first resonance channels C1. The upper cover 230 is disposed on the first dividing elements 212, and the upper cover 230 may be fastened at the first dividing elements 212 by a plurality of screws (not shown). The first resonance channels C1 are located in a first accommodating space formed by the upper cover 230, the first ends 222 of the circuit boards 220 and the first surface 211a of the solid conductive body 211.

Figure 4:
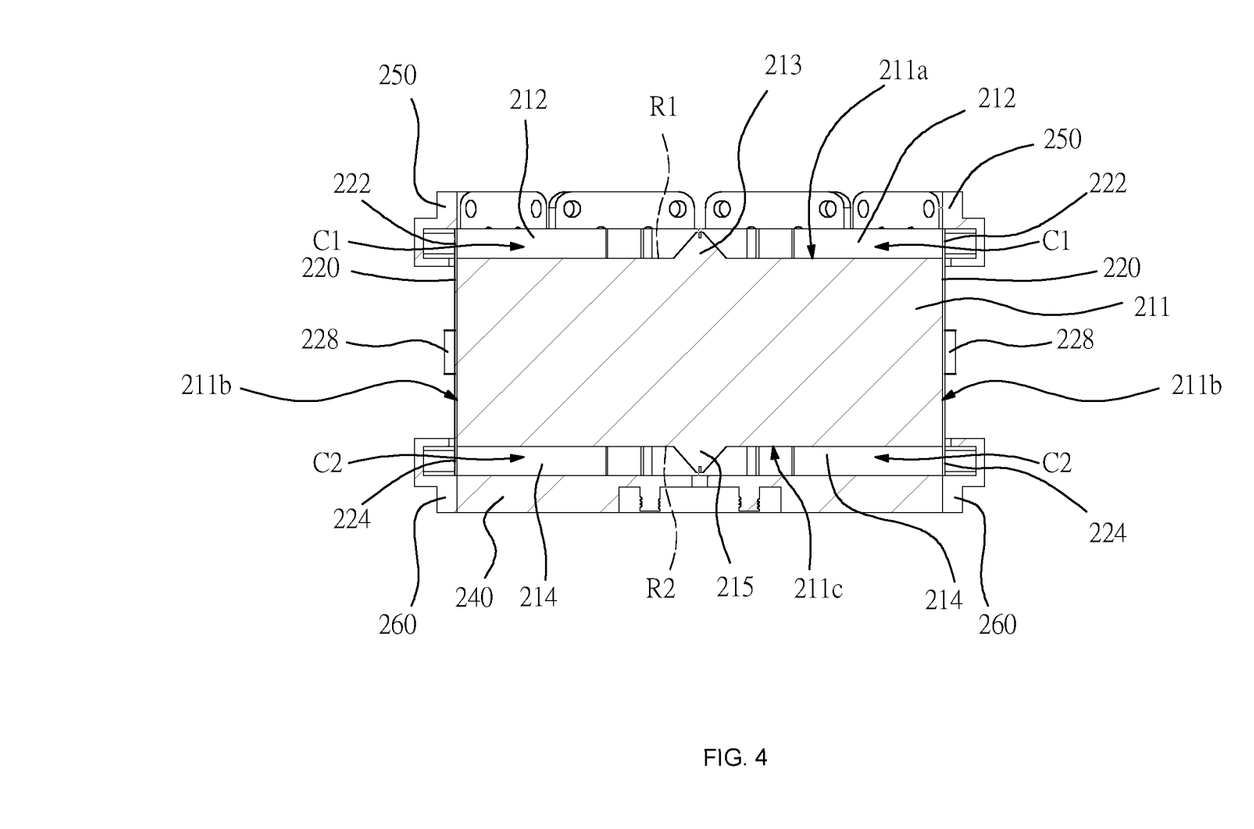
FIG. 4 shows a section schematic diagram of the power dividing and combining device in FIG. 2 along the line AA', wherein some of the components omitted.
Figure 5:
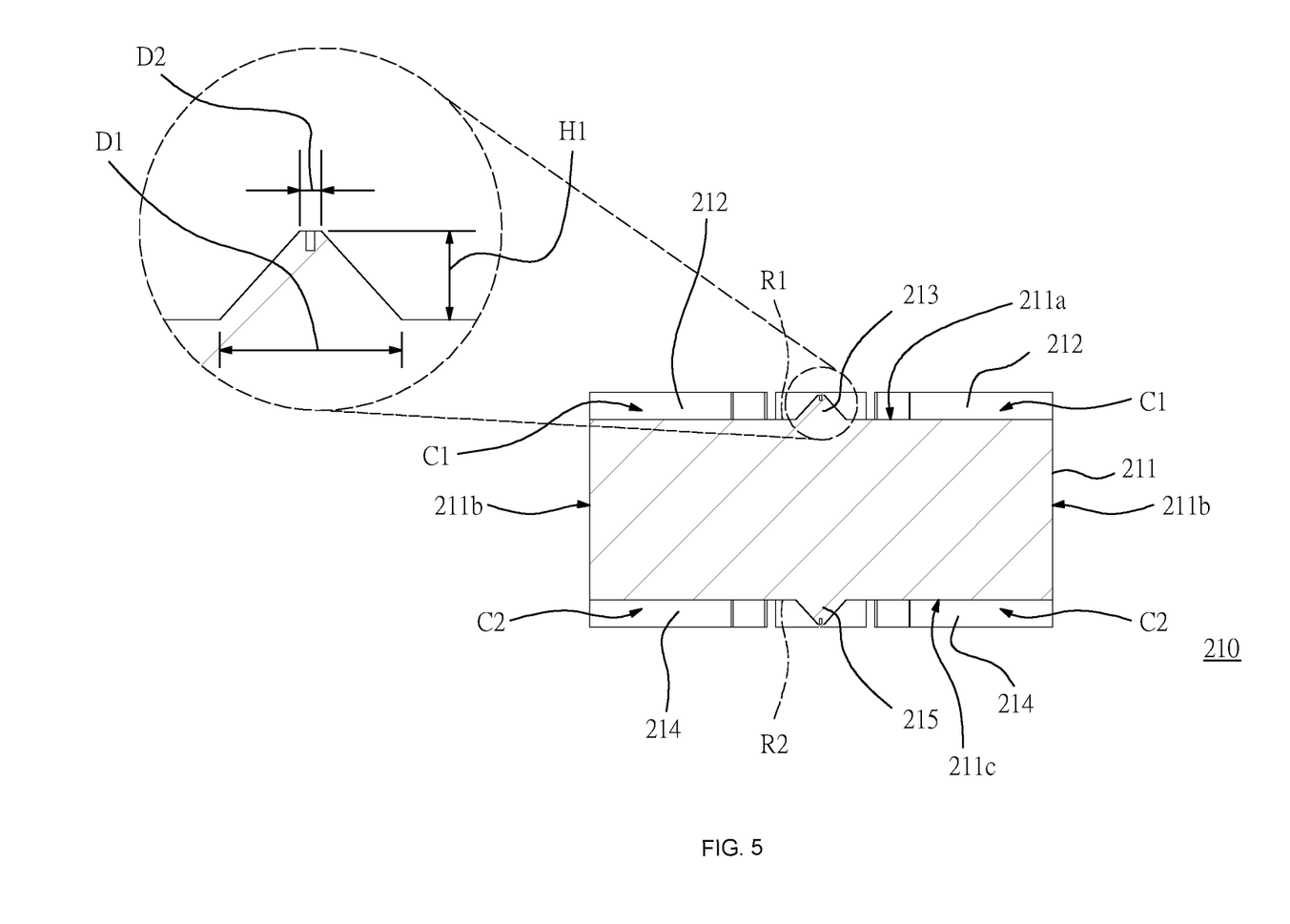
FIG. 5 shows a section schematic diagram of the resonance body in FIG. 3 along the line BB'.

FIG. 4 shows a section schematic diagram of the power dividing and combining device in FIG. 2 along the line AA', wherein some of the components omitted. FIG. 5 shows a section schematic diagram of the resonance body in FIG. 3 along the line BB'. Referring to FIG. 3, FIG. 4 and FIG. 5, the resonance body 210 further includes a plurality of second dividing elements 214 and a signal-transmitting end 215. The solid conductive body 211 further has a second surface 211c that is opposite to the first surface 211a, and each of the side surfaces 211b connects the first surface 211a and the second surface 211c. The second dividing elements 214 are disposed on the second surface 211c of the solid conductive body 211. The second dividing elements 214 separate a plurality of second resonance channels C2 on the second surface 211C. The second resonance channels C2 intersect at a second common region R2 on the second surface 211c. The signal-transmitting end 215 is disposed on the second surface 211c of the solid conductive body 211 and is located in the second common region R2. In this embodiment, the signal-transmitting end 215 may be located at or near a center of the second surface 211c of the solid conductive body 211.

It should be noted that, in this embodiment, the arrangement of the first resonance channels C1 may be symmetrical to the arrangement of the second resonance channels C2. In other words, the number of the first resonance channels C1 in this embodiment is equal to the number of the second resonance channels C2. The first resonance channels C1 are at equal angles (36 degrees in this embodiment, for example) in an annular arrangement around the first common region R1, and the second resonance channels C2 are at equal angles in an annular arrangement around the second common region R2. Moreover, the position of each of the first resonance channels C1 corresponds to the position of one of the second resonance channels C2 in one-on-one symmetry, and the shape of each of the first resonance channels C1 corresponds to the shape of one of the second resonance channels C2 in one-on-one symmetry. However, in another embodiment, according to design requirements, the arrangement of the first resonance channels C1 may be non-symmetrical to the arrangement of the second resonance channels C2.

In this embodiment, the shape and the position of the signal-receiving end 213 may be symmetrical to the shape and the position of the signal-transmitting end 215, respectively. Each of the signal-receiving end 213 and the signal-transmitting end 215 may be a cone. A bottom diameter D1 of the cone is, for example, 5 to 7 mm, a top diameter D2 is, for example, 0.2 to 2 mm, and the height H1 is, for example, 2 to 5 mm. The ratio of the bottom diameter D1, the top diameter D2 and the height H1 is, for example, approximately 6:1:3.5. In this embodiment, the solid conductive body 211, the first dividing elements 212, the second dividing elements 214, the signal-receiving end 213 and the signal-transmitting end 215 may be integrally formed of a metal material including one single metal or alloy. However, in another embodiment, according to design requirements, the shape and the position of the signal-receiving end may be non-symmetrical to the shape and the position of the signal-transmitting end.

Again referring to FIG. 1, FIG. 2 and FIG. 4, each of the circuit boards 220 disposed on the corresponding side surface 211b of the solid conductive body 211 has a second end 224 opposite to the first end 222. The second end 224 of each circuit board 220 closes one second resonance channel C2 of the second resonance channels C2. The lower cover 240 is disposed on the second dividing elements 214, and the lower cover 240 may be fastened to the second dividing elements 214 by a plurality of screws (not shown). The second resonance channels C2 are located in a second accommodating space formed by the lower cover 240, the second ends 224 of the circuit boards 220 and the second surface 211c of the solid conductive body 211.

In this embodiment, a grounding layer (not shown) on a back surface (facing the corresponding side surface 211b of the solid conductive body 211) of each circuit board 220 may be in electrical contact with the solid conductive body 211. Moreover, a power-amplifying element 228 (for example, a power amplification chip) is disposed on a conductive trace 226 on a front surface (opposite to the corresponding back surface) of each of the circuit boards 220.

In this embodiment, the circuit boards 220 are fixed on the side surfaces 211b of the solid conductive body 211 by means of the first fixing elements 250 and the second fixing elements 260. The first fixing elements 250 may be disposed on the upper cover 230 by a plurality of screws (not shown), and respectively fix the circuit boards 220 on the side surfaces 211b of the solid conductive body 211. The second fixing elements 260 may be disposed on the lower cover 240 by a plurality of screws (not shown), and respectively fix the circuit boards 220 on the side surfaces 211b of the solid conductive body 211. Moreover, each of the first fixing elements 250 may be in electrical contact with a plurality of first grounding pads 221 on the front surface of the corresponding circuit board 220. Each of the second fixing elements 260 may be in electrical contact with a plurality of second grounding pads 223 on the front surface of the circuit board 220.

The operation of the power dividing and combining device 200 of the embodiment is described below. When an external signal is transmitted to the signal-receiving end 213 of the power dividing and combining device 200, the external signal is divided into a plurality of sub-signals by the first resonance channels C1. Each of the sub-signals is transmitted through the corresponding first resonance channel C1 to the corresponding circuit board 220 (which is disposed on the end of the corresponding first resonance channel C1). Next, each of the sub-signals is amplified under the action of the power-amplifying element 228 of the corresponding circuit board 220 and is further transmitted to the corresponding second resonance channel C2. Then, the sub-signals pass through the second resonance channels C2 and are combined at the signal-transmitting end 215, and the combined signal is transmitted out by the signal-transmitting end 215.

On the basis of the description above, the power dividing and combining device of the embodiment of the present invention at least provides one of the following advantages. The power dividing and combining device including the resonance body is capable of dividing the power of a received electromagnetic wave signal, and individually amplifying and then combining the divided power thereof, thereby completing power amplification of the electromagnetic wave signal. Accordingly, compared to the prior art, a predetermined power of each of the power-amplifying elements of the power dividing and combining device of the embodiment of the present invention may be lower. The temperature of the individual one of the power-amplifying elements during operation is also lower so that overheat thereof is unlikely to occur and the operation lifecycle thereof can be prolonged. In addition, power-amplifying elements with low power are generally product items not subject to export control and may be more easily acquired.

We claim:

1. A power dividing and combining device, comprising:
a resonance body, comprising:
a solid conductive body, having a first surface, a second surface opposite to the first surface, and a plurality of side surfaces connecting the first surface and the second surface;
a plurality of first dividing elements, disposed on the first surface and separate a plurality of first resonance channels on the first surface, wherein the first resonance channels intersect at a first common region on the first surface;
a plurality of second dividing elements, disposed on the second surface and separate a plurality of second resonance channels on the second surface, wherein the second resonance channels intersect at a second common region on the second surface;
a signal-receiving end, disposed on the first surface and in the first common region; and
a signal-transmitting end, disposed on the second surface and in the second common region;
a plurality of circuit boards, disposed respectively on the side surfaces, wherein two opposite ends of each of the circuit boards respectively close one of the first resonance channels and one of the second resonance channels, and each of the circuit boards comprises a power-amplifying element;
an upper cover, disposed on the first dividing elements, wherein the first resonance channels are located in a first accommodating space formed by the upper cover, the circuit boards and the first surface of the solid conductive body; and
a lower cover, disposed on the second dividing elements, wherein the second resonance channels are located in a second accommodating space formed by the lower cover, the circuit boards and the second surface of the solid conductive body.

2. The power dividing and combining device according to claim 1, wherein an arrangement of the first resonance channels is symmetrical to an arrangement of the second resonance channels.

3. The power dividing and combining device according to claim 1, wherein a shape and a position of the signal-receiving end are symmetrical to a shape and a position of the signal-transmitting end, respectively.

4. The power dividing and combining device according to claim 2, wherein a shape and a position of the signal-receiving end are symmetrical to a shape and a position of the signal-transmitting end, respectively.

5. The power dividing and combining device according to claim 1, wherein the signal-receiving end is a cone and the signal-transmitting end is a cone.

6. The power dividing and combining device according to claim 1, further comprising:
a plurality of first fixing elements, disposed on the upper cover and respectively fixing the circuit boards on the side surfaces; and
a plurality of second fixing elements, disposed on the lower cover and respectively fixing the circuit boards on the side surfaces.

7. The power dividing and combining device according to claim 6, wherein each of the first fixing elements is in electrical contact with a first grounding pad of one of the circuit boards, and each of the second fixing elements is in electrical contact with a second grounding pad of one of the circuit boards.

8. A resonance body, comprising:
a solid conductive body, having a first surface, a second surface opposite to the first surface, and a plurality of side surfaces connecting the first surface and the second surface;
a plurality of first dividing elements, disposed on the first surface and separate a plurality of first resonance channels on the first surface, wherein the first resonance channels intersect at a first common region on the first surface;

a plurality of second dividing elements, disposed on the second surface and separate a plurality of second resonance channels on the second surface, wherein the second resonance channels intersect at a second common region on the second surface;

a signal-receiving end, disposed on the first surface and in the first common region; and a signal-transmitting end, disposed on the second surface and in the second common region.

9. The resonance body according to claim 8, wherein an arrangement of the first resonance channels is symmetrical to an arrangement of the second resonance channels.

10. The resonance body according to claim 8, wherein a shape and a position of the signal-receiving end are symmetrical to a shape and a position of the signal-transmitting end, respectively.

11. The resonance body according to claim 9, wherein a shape and a position of the signal-receiving end are symmetrical to a shape and a position of the signal-transmitting end, respectively.

12. The resonance body according to claim 8, wherein the signal-receiving end is a cone and the signal-transmitting end is a cone.

13. The power dividing and combining device according to claim 1, wherein the first resonance channels are open hollow channels, and the second resonance channels are open hollow channels.

14. The power dividing and combining device according to claim 1, wherein the solid conductive body, the first dividing elements, the second dividing elements, the signal-receiving end and the signal-transmitting end are integrally formed.

15. The resonance body according to claim 8, wherein the first resonance channels are open hollow channels, and the second resonance channels are open hollow channels.

16. The resonance body according to claim 8, wherein the solid conductive body, the first dividing elements, the second dividing elements, the signal-receiving end and the signal-transmitting end are integrally formed.

* * * * *